US009262562B2

(12) United States Patent
Sudama et al.

(10) Patent No.: US 9,262,562 B2
(45) Date of Patent: Feb. 16, 2016

(54) SYSTEM AND METHOD FOR MODELING A PHYSICAL FORMATION

(71) Applicant: DASSAULT SYSTEMES CANADA SOFTWARE INC., Vancouver (CA)

(72) Inventors: Ram Sudama, Nanoose Bay (CA); Steven George Carter, Wellington Point (AU)

(73) Assignee: DASSAULT SYSTEMES CANADA SOFTWARE INC., Vancouver, BC (CA)

( * ) Notice: Subject to any disclaimer, the term of this patent is extended or adjusted under 35 U.S.C. 154(b) by 455 days.

(21) Appl. No.: 13/852,561

(22) Filed: Mar. 28, 2013

(65) Prior Publication Data
US 2013/0262062 A1 Oct. 3, 2013

Related U.S. Application Data

(60) Provisional application No. 61/618,292, filed on Mar. 30, 2012.

(51) Int. Cl.
*G06F 7/50* (2006.01)
*G06F 17/50* (2006.01)

(52) U.S. Cl.
CPC ........ *G06F 17/5009* (2013.01); *G06F 17/5018* (2013.01)

(58) Field of Classification Search
CPC ........................... G06F 17/5018; G06F 17/5009
USPC ............................ 703/2, 10, 1, 6, 9; 702/6, 13
See application file for complete search history.

(56) References Cited

U.S. PATENT DOCUMENTS

| | | | | |
|---|---|---|---|---|
| 7,519,515 B2 * | 4/2009 | Froyland | ................. | E21C 41/26 299/19 |
| 7,603,265 B2 | 10/2009 | Mainguy et al. | | |
| 8,095,349 B2 | 1/2012 | Kelkar et al. | | |
| 2003/0215110 A1 * | 11/2003 | Rhoads | ................. | G01C 11/00 382/100 |
| 2004/0223636 A1 * | 11/2004 | Edic | ..................... | G06T 7/0012 382/131 |
| 2008/0127011 A1 * | 5/2008 | Kobayashi | .......... | G06F 17/5018 716/111 |

OTHER PUBLICATIONS

Li et al. "Research on force-sensing element's spatial arrangement of piezoelectric six-component force/torque sensor". 2009 Mechanical Sytstem and Signal Process 23, p. 2687-2698.*
Afzal et al. "Delineation of mineralization zones in porphyry Cu deposits by fractal concentration—volume modeling"., Journal of Geochemical Exploration 108 (2011). p. 220-232.*

* cited by examiner

*Primary Examiner* — Eunhee Kim

(57) ABSTRACT

A system and method for modeling a physical formation is provided. The method comprises a model retrieval module obtaining a reference model of the physical formation with at least one physical parameter, the reference model comprising reference blocks. A re-blocking module generates a synthesized model comprising one or more synthesized blocks. The re-blocking module then maps the reference blocks to the synthesized blocks and generates one or more fractional attributes for one or more of the synthesized blocks based on at least one physical parameter of the one or more corresponding reference blocks.

21 Claims, 11 Drawing Sheets

SYSTEM AND METHOD FOR MODELING A PHYSICAL FORMATION

TECHNICAL FIELD

The following relates generally to modeling a physical formation.

BACKGROUND

Modeling a physical formation is useful in many applications. For example, modeling a geologic formation is useful in mapping or assessing a geologic asset such as an ore deposit. A model of a physical formation is used as a map when planning a mine, for example. A model of a physical formation may also be used to estimate the value of a resource contained within the formation.

The size of a physical formation that is to be modeled may vary widely. Typically, models consist of a plurality of finite elements known as blocks. A model of a geologic formation may have thousands, or even millions of blocks. A model having thousands or millions of blocks may be cumbersome in terms of processing and storage required to access and manipulate the model.

One way to reduce the computing power required to manipulate a block model is to reduce the number of blocks in the model. This may be accomplished by "re-blocking" the model to increase the size of each block, thereby decreasing the total number of blocks. For example, a block model having 1 000 000 blocks may be re-blocked such that each new block comprises 1000 old blocks. Each of the 1000 new blocks represents, in aggregate, the attributes of the blocks from which each is derived.

However, condensing a block model by reducing the number of blocks in the model causes resolution to be lost. Therefore, re-blocking has the unintended negative consequence of causing data loss in a block model.

SUMMARY

In one aspect, a method for modeling a physical formation is provided. The method comprises obtaining a reference model of the physical formation. A synthesized model comprising one or more synthesized spatial elements is generated. The reference model is mapped to the synthesized model. A fractional attribute for one or more of the synthesized spatial elements is generated by a processor based on at least one physical parameter of one or more corresponding reference spatial elements of the reference model.

The one or more synthesized spatial elements may be rectangular prisms. The position and geometry of each of the one or more rectangular prism-shaped synthesized spatial elements is defined by six elements. Each of the six elements may be stored in a separate file stream. In an example embodiment, at least one physical parameter assigned to each of the reference spatial elements is a geologic attribute.

This summary is provided to introduce a selection of concepts in a simplified form, examples of which are described in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Embodiments will now be described by way of example only with reference to the appended drawings wherein.

DETAILED DESCRIPTION

Figure 1:
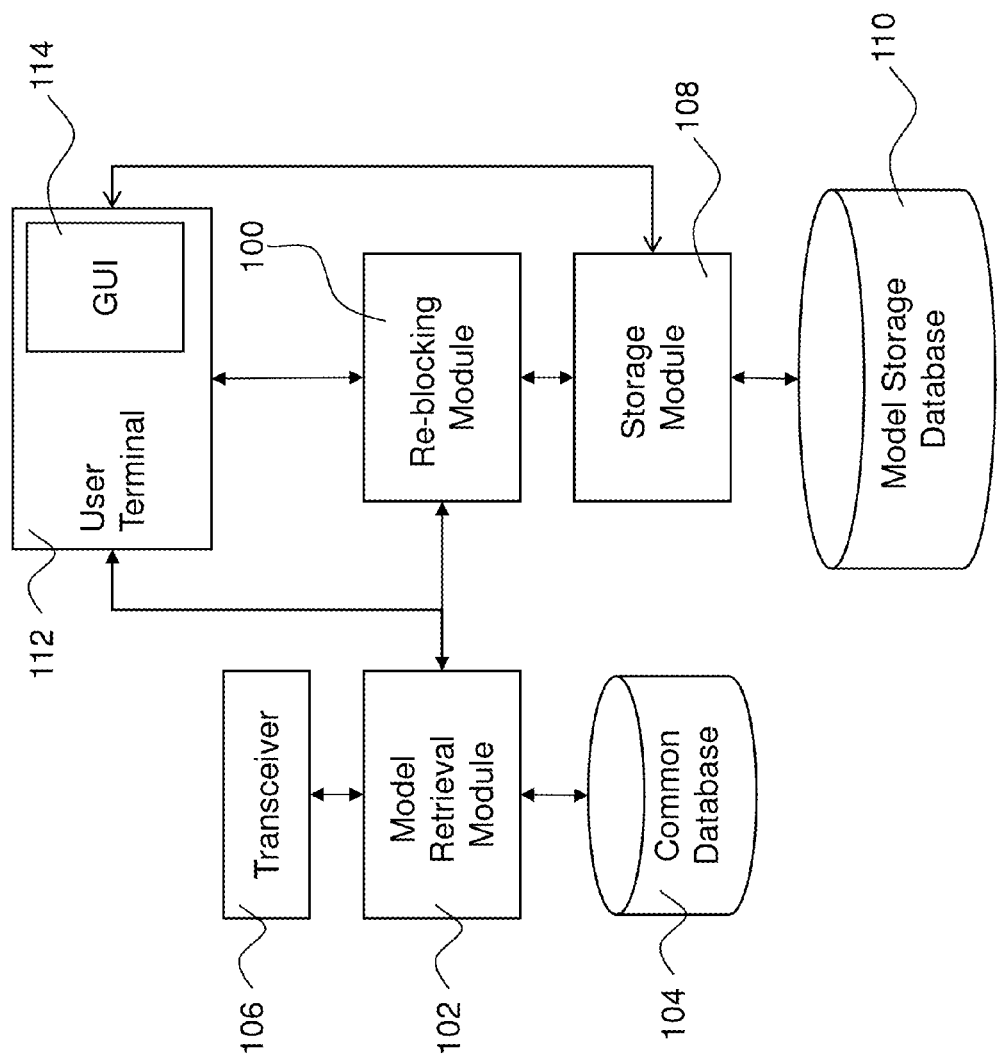
FIG. 1 is a block model of an example system in accordance with the present invention.

A system and method are provided for re-blocking a block model of a physical formation. A block model may be used to model a geologic formation, for example, to estimate the value of a geologic asset. A block model may also be used as a map, for example, to conduct and plan operations within a mine. The example system and method described herein are directed to modeling physical formations as well as mapping geologic features while operating or planning operations on physical features, for example, mining operations.

It will be appreciated that although the term "block" is used to describe the finite elemental volume of each of the spatial elements in a model, the spatial elements are not restricted to rectangular blocks. For example, the blocks may be irregular, trapezoidal, ovoid, cylindrical, hexagonal, rhombohedral, etc. Blocks may be three dimensional blocks. The blocks may have more, or fewer than, three dimensions. For example, blocks may be two dimensional and may represent the area of a physical formation. It will be appreciated that the axes of a synthesized block model may differ from the principal axis of the one or more reference models from which the synthesized model was generated.

In one aspect, the system is operable to generate a synthesized block model from a reference block model. The reference block model comprises a plurality of reference blocks. The total number of blocks in a synthesized model may be greater, equal to, or less than, than the total number of blocks in the reference model from which the synthesized model was generated. Each of the reference blocks comprises at least one physical parameter, for example, a physical attribute associated with the geology represented by the volume of the block. The synthesized block model comprises one or more synthesized blocks.

Synthesized blocks partially coincide with one or more reference blocks. If a synthesized block does not partially coincide with any reference blocks in a reference model, the synthesized blocks may be assigned a default attribute value associated with the model. Synthesized blocks may be defined by fractional attributes and other types of attributes. It will be appreciated that the synthesized blocks and reference blocks may be described by any coordinate system, however, for simplicity, the Cartesian co-ordinate system will be used to describe the synthesized block model in examples provided herein. Other example coordinate systems include cylindrical coordinate systems and spherical coordinate systems.

The reference block model may comprise voids between blocks. A synthesized block model may be generated based on a reference block model having voids. Voids in a reference block model may be assigned a default attribute value which may be used when generating a synthesized block model. For example, voids in a reference block model may be filled by automatically categorizing the volume corresponding to the voids as "waste". Hence, a contiguous synthesized model completely free of voids may be generated from a reference block model having one or more voids. It will be appreciated, however, that the synthesized model may comprise voids between blocks.

Block models are stored as data files. Block models comprising hundreds of thousands or millions of blocks can be very large in file size and their storage may require a large amount of computer memory. Typically, block models comprising millions of blocks are too large to be effectively manipulated by random access memory (RAM) and are therefore manipulated by storage drives, for example, hard disk drives.

A synthesized block model may be generated with fewer blocks than the reference model from which it is derived, reducing the memory required to manipulate the model, and thereby facilitating computer manipulation of the model. A method is provided for storing in memory, and accessing from memory, a block model, as is outlined below.

The geometry and position of each of the synthesized blocks may be defined, for example, using a plurality of spatial elements. To facilitate manipulation of a block model, the model may be stored in a plurality of file streams, each file stream being simultaneously accessible. For example, a synthesized block in the shape of a rectangular prism may be defined by six elements. By way of example, these elements may comprise the co-ordinates of two opposing points of each synthesized block. It will be appreciated that the synthesized blocks may be defined by elements according to other formats. Each of the elements, for example six elements, may be accessed simultaneously to reduce the time required to access and/or manipulate the model.

The reference model used to generate the synthesized model may comprise, for example, a regular block model, a regular sub-blocked model, an irregular sub-blocked model, a seam model, or a rotated block model. The reference block model may comprise a previously generated synthesized block model.

Turning to FIG. 1, a system for modeling a physical formation is provided. The system comprises a re-blocking module 100 in communication with a model retrieval module 102. The re-blocking module 100 is also in communication with a storage module 108. The storage module 108 is in communication with a model storage database 110. The re-blocking module 100 may be in communication with a user terminal 112, which may comprise a display having a graphical user interface (GUI) 114. The user terminal 112 may be used to configure the re-blocking operation.

The model retrieval module 102 may be in communication with a common database 104, which contains reference block models. The model retrieval module 102 may also be in communication with a transceiver 106, enabling the model retrieval module 102 to retrieve reference block models over a network, for example, the internet. The model retrieval module 102 is operable to retrieve various types of block models, including reference block models. The model retrieval module 112 is operable to provide retrieved reference block models to the re-blocking module 100.

The re-blocking module 100 comprises a memory and a processor. The user terminal 112 may also comprise a memory and a processor. The memory comprises thereon computer instructions which, when executed by the processor, enables the system to provide the functionality described herein.

The re-blocking module 100 generates a fractional attribute for each synthesized block based on the at least one physical parameter assigned to each of the reference blocks which coincide with the synthesized block. A fractional attribute is generated based on a spatial element and a physical element. For example, a fractional attribute may be generated based on the proportion of a synthesized block that coincides with a reference block and a physical parameter associated with the reference block. In a more specific example, the attribute may comprise a percentage value of the synthesized block that coincides with a particular geologic formation. The fractional attribute may comprise a fraction of a block comprising a certain percentage a particular constituent. The re-blocking module 100 assigns the fractional attribute to the synthesized block.

A synthesized block model may also be generated from two or more reference block models, as is described herein.

The re-blocking module 100 is operable to generate a synthesized block model from one or more reference block models. The synthesized block model may be generated in accordance with one or more specific block parameters, comprising, for example, the size, position, orientation, geometry and attributes associated with the synthesized block model. The synthesized block parameters may be predetermined, calculated from an algorithm, or user-specified. For example, the re-blocking module 100 may be operable to receive block parameters from the user terminal 112.

As will be further described herein, the user terminal 112 is operable to receive block parameters from a user via the GUI 114 and provide the block parameters to the re-blocking module 100. This enables a user, for example, a mining engineer to provide the user terminal 112 with desired block parameters via the GUI 114. The user terminal 112 then provides the desired block parameters to the re-blocking module 100 which will use the parameters in the re-blocking operation.

Similarly to reference block models, synthesized blocks may be of various geometries including, for example, rectangular, triangular, rectangular prisms, cylinders, or comprise irregular volumes. The model storage database 110 stores the geometry and position of each block of the synthesized block model. For example, if the synthesized block model comprises a plurality of rectangular prism blocks, the model storage database 110 stores the size, position and geometry of each one of the synthesized blocks within the model storage database 110. For example, to store the size, position and geometry of a rectangular prism synthesized block, six values may be used. For example, the six values may comprise the three dimensional coordinates of a midpoint of the volume of the block as well as a measurement for the height, length and width of the block.

As a synthesized model may comprise thousands or even millions of individual blocks, the computational power traditionally required to retrieve, display, and manipulate information relating to particular regions in the block model may be extensive, particularly for a storage medium that cannot be accessed randomly (i.e. one that is not stored in RAM). To reduce the time required to access and perform computations to individual blocks, each of the values describing the size, geometry and position of the blocks may be stored in a separate data stream. Referring again to the example of rectangular prism synthesized blocks, each of the six spatial elements that are used to describe the blocks may be stored in a separate data stream to enable the values to be retrieved simultaneously, notwithstanding the type of storage medium used.

The storage module 108 may store each of the spatial elements of the one or more synthesized blocks in a separate file stream. For example, in the case of a rectangular prism synthesized block, each of the six elements that define the position and geometry of a rectangular prism synthesized block is stored in a separate file stream. Storage of each of the elements in separate file streams enables the system to seek information relating to a particular block without requiring the system to index that block. By storing the six elements in separate file streams, each of the six elements may be accessed simultaneously. The position of the synthesized block being accessed by a user enables the storage module to retrieve geologic and fraction attributes relating to the synthesized block.

Figure 2:
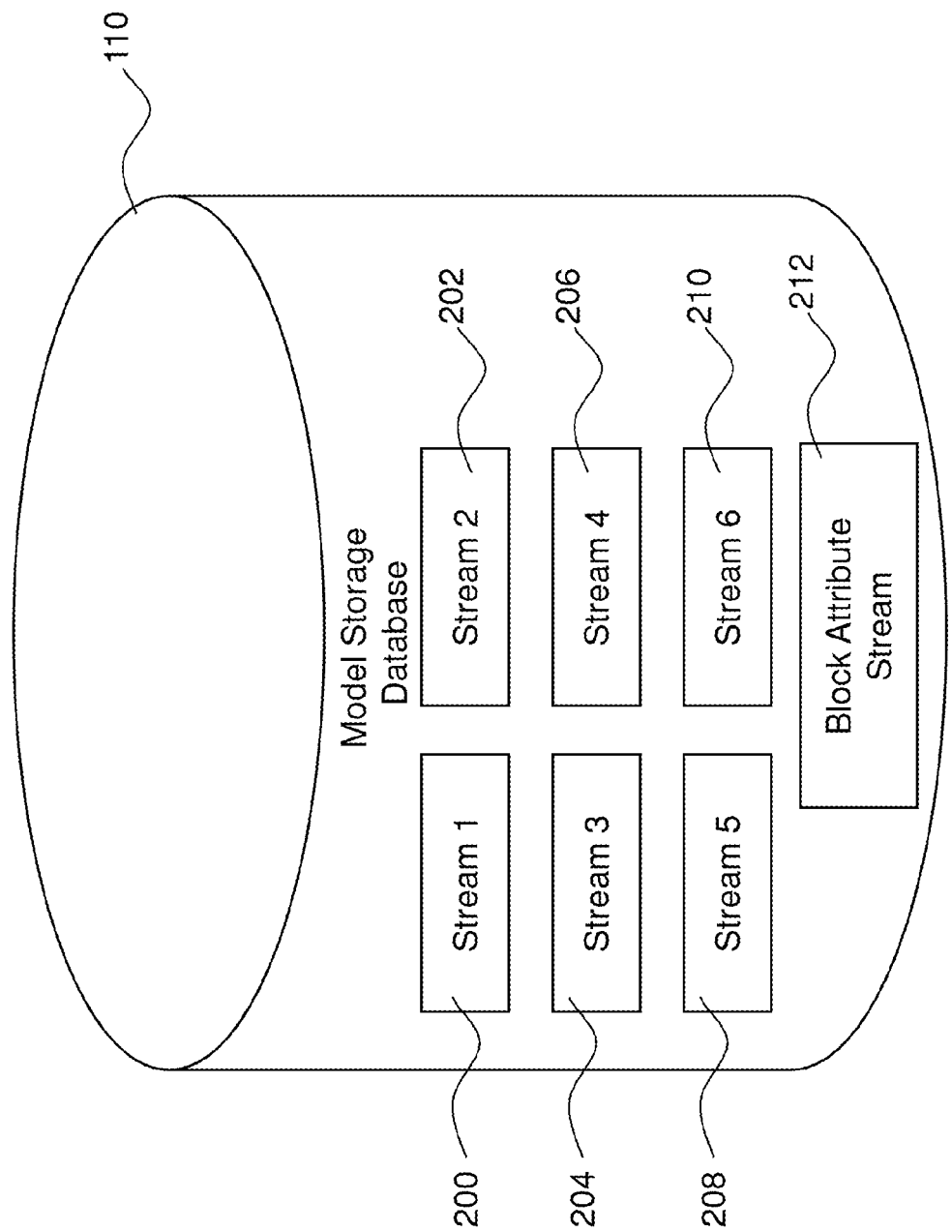
FIG. 2 is a diagram illustrating an example model storage database.

Referring to FIG. 2, an example model storage database 110 is provided. The model storage database 110 comprises streams one 200, two 202, three 204, four 206, five 208, and six 210. Each of the streams may be accessed simultaneously or sequentially, if desired. For example, the storage module 108 may be operable to access stream one 200 and stream two 202 simultaneously. The storage module 108 may also be operable to access all six data streams 200 to 210 simultaneously to access values relating to one or more synthesized blocks more quickly relative to accessing a single data stream.

Block attributes may be stored in a block attribute stream 212 in the model storage database 110. In one embodiment, the attributes stream 212 is written in the same order as the position data streams 200, 202, 204, 206, 208, and 210. Attributes may be mapped to their attributes based on their position in each of the streams. For example, the first entry of attributes in the attribute stream may be mapped to the first entry of the spatial elements in the data streams 200, 202, 204, 206, 208, and 210. Similarly, the tenth entry of attributes in the attribute stream may be mapped to the tenth entry of the spatial elements. Attributes may be retrieved from the attribute stream 212 based on the order in which the attributes are saved. String attributes may be processed in this manner by limiting the string attributes to a fixed length.

A block attribute may comprise, for example, the mean grade of ore in a particular synthesized block. A block attribute may also comprise a fractional attribute, as will be explained further herein. The storage module 108 may be operable to provide the block geometry stored in the six data streams 200 to 210 to the re-blocking module 100 and/or to the user terminal 112. For example, if a user requests information relating to features within a segment of a synthesized block model via the GUI 114, the storage module 108 may obtain block information from the model storage database 110. The storage module 108 may be operable to access each of the six streams of block data simultaneously from the model storage database 110. The storage module 108 may provide the blocks and block attributes to the user terminal 112. The user terminal 112 may display the block information to the user.

Figure 3:
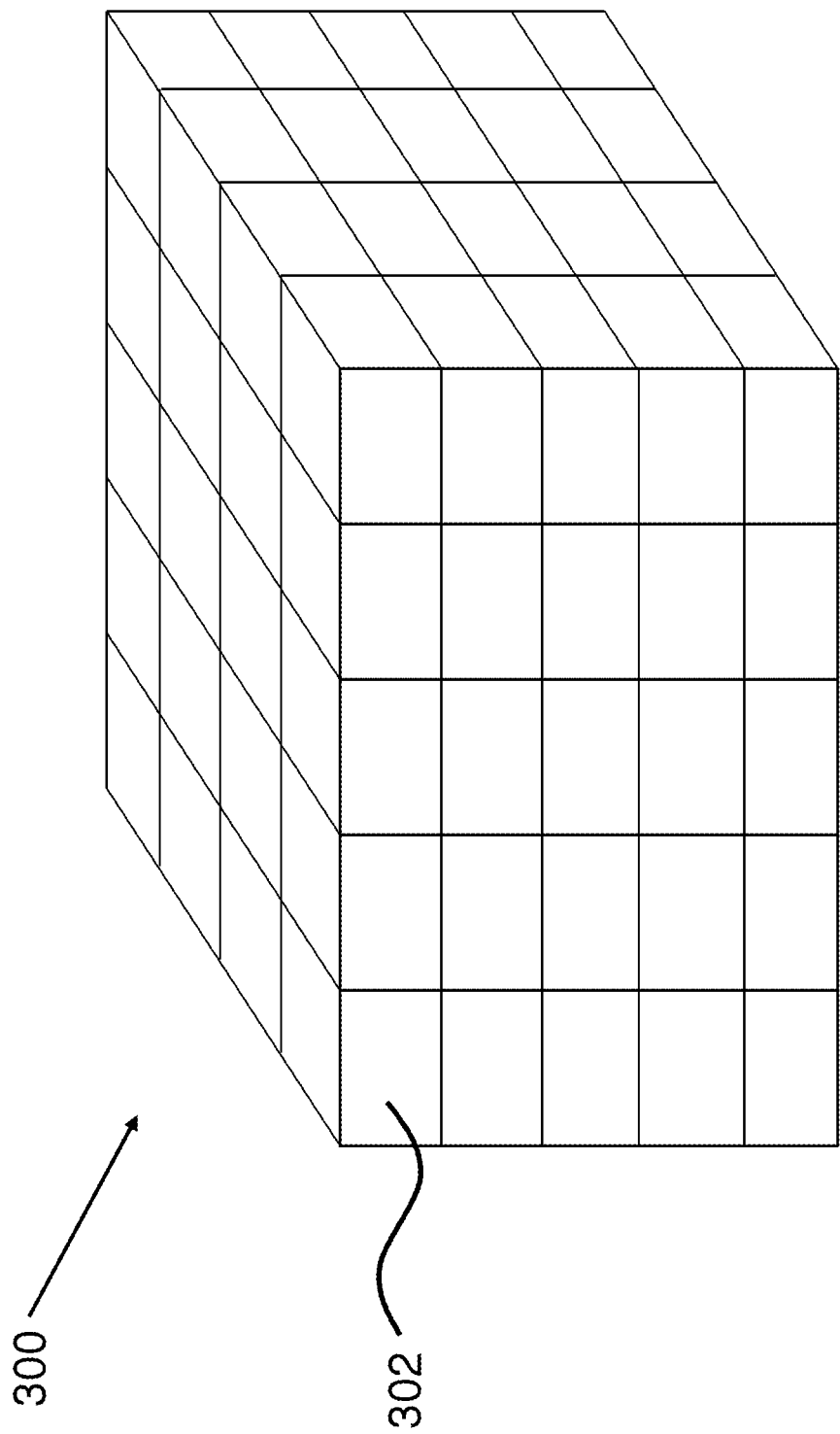
FIG. 3 is a diagram of an example block model coordinate system.

Turning to FIG. 3, an example reference block model 300 is shown. The reference block model 300 comprises a plurality of spatial elements, e.g. blocks, one of which is represented by numeral 302. Each reference block has previously been assigned one or more attributes. The block model 300 as shown in FIG. 3 comprises one-hundred blocks, however, block models may comprise thousands or millions of individual blocks. As can be seen from the figure, the blocks are uniform and contiguous in the x, y and z dimensions, however, other models may comprise non-contiguous blocks and blocks of non-uniform size and geometry. Each of the blocks within the model may be defined by the six spatial elements, as defined above. For example, reference block 300 may be defined by the three Cartesian coordinates corresponding to the centre of the block as well as the dimensions of each of the sides of the block. Reference block 302 may otherwise be defined by the Cartesian coordinates of two opposing corners of the block. It can be appreciated that other methods of defining the reference block 302 may be employed and represented by the six spatial elements.

The reference block model 300 may be a model of a geologic formation, for example, a mineral deposit. A mineral deposit of interest is typically a potentially economically viable asset and a block model is used to estimate its economic value, estimate the cost of extraction, plan mining operations, and assess the mining infrastructure required for extraction. The mineral deposit may be modeled to estimate the cost of extracting the asset and the mining structure required to extract the asset. The mineral deposit may also be modeled to plan mining operations. For example, the mineral deposit may be modeled to determine the optimum sequence in which to mine each region of the mineral deposit.

Figure 4:
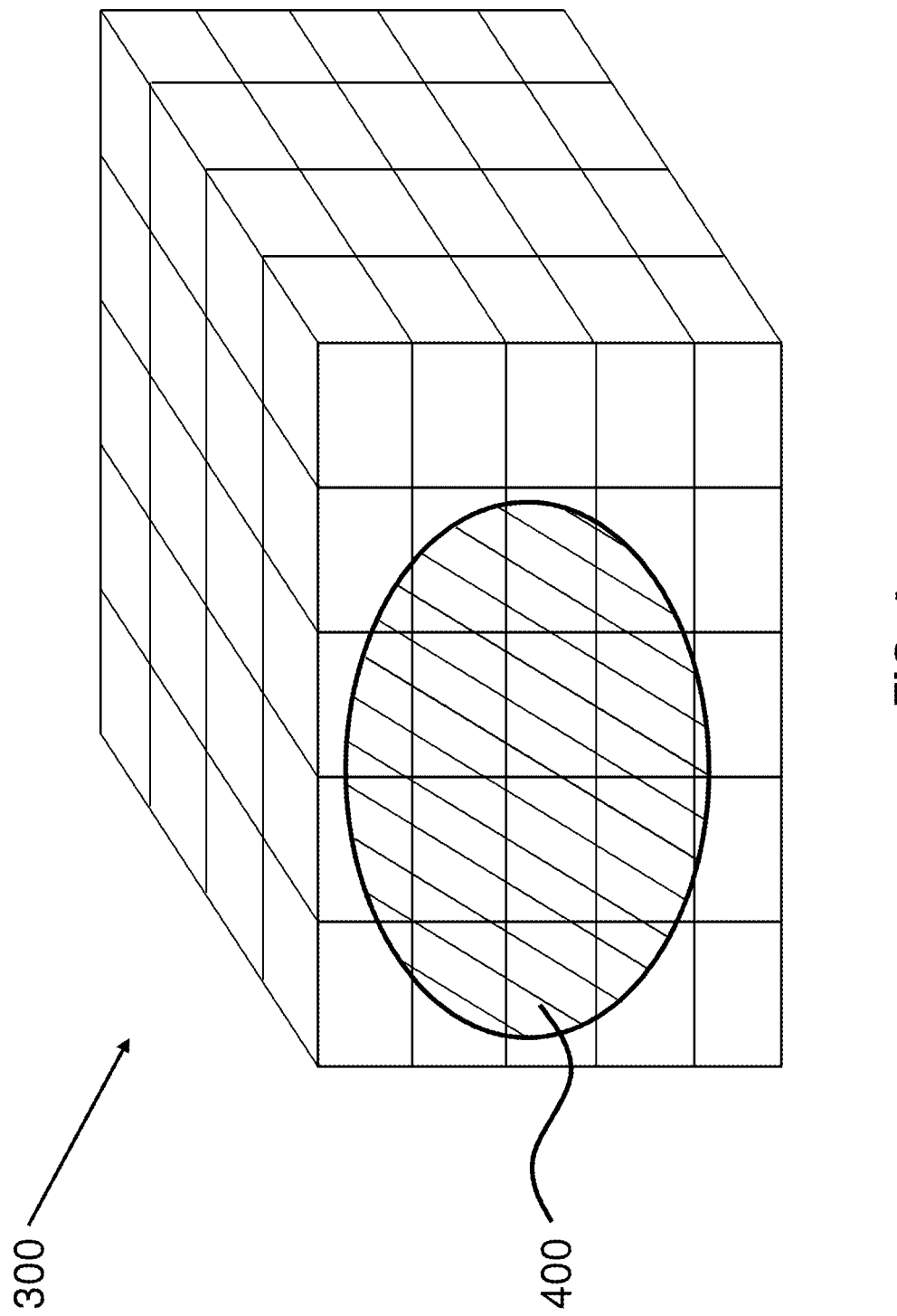
FIG. 4 is a diagram of an example block model of a physical formation.

Turning to FIG. 4, each reference block within the reference block model is assigned an attribute. For example, a model of a geologic asset may comprise an ore grade value. For example, if reference block model 300 is a representation of a gold ore asset, the asset may comprise a gold lode 400. The lode 400 may coincide with several of the reference blocks in the reference model 300. Each of the reference blocks may be assigned an attribute comprising the grade of ore within that reference block. The reference block may also be assigned various other attributes such as the grade of other types of ore within the block, the density of the block, the type of minerals in the block, etc. Reference blocks not coinciding with the lode 400 may be assigned an attribute associated with their characteristics, for example, the type of rock or soil that the block volume represents. Attributes of the blocks that do not coincide with the lode may be useful to determine the cost associated with removing that block or to estimate the structural integrity of a mine structure. The block model 300 comprising a plurality of blocks each having been assigned one or more attributes may be used to estimate the total value of the asset or to plan and conduct mining operations.

Figure 5:
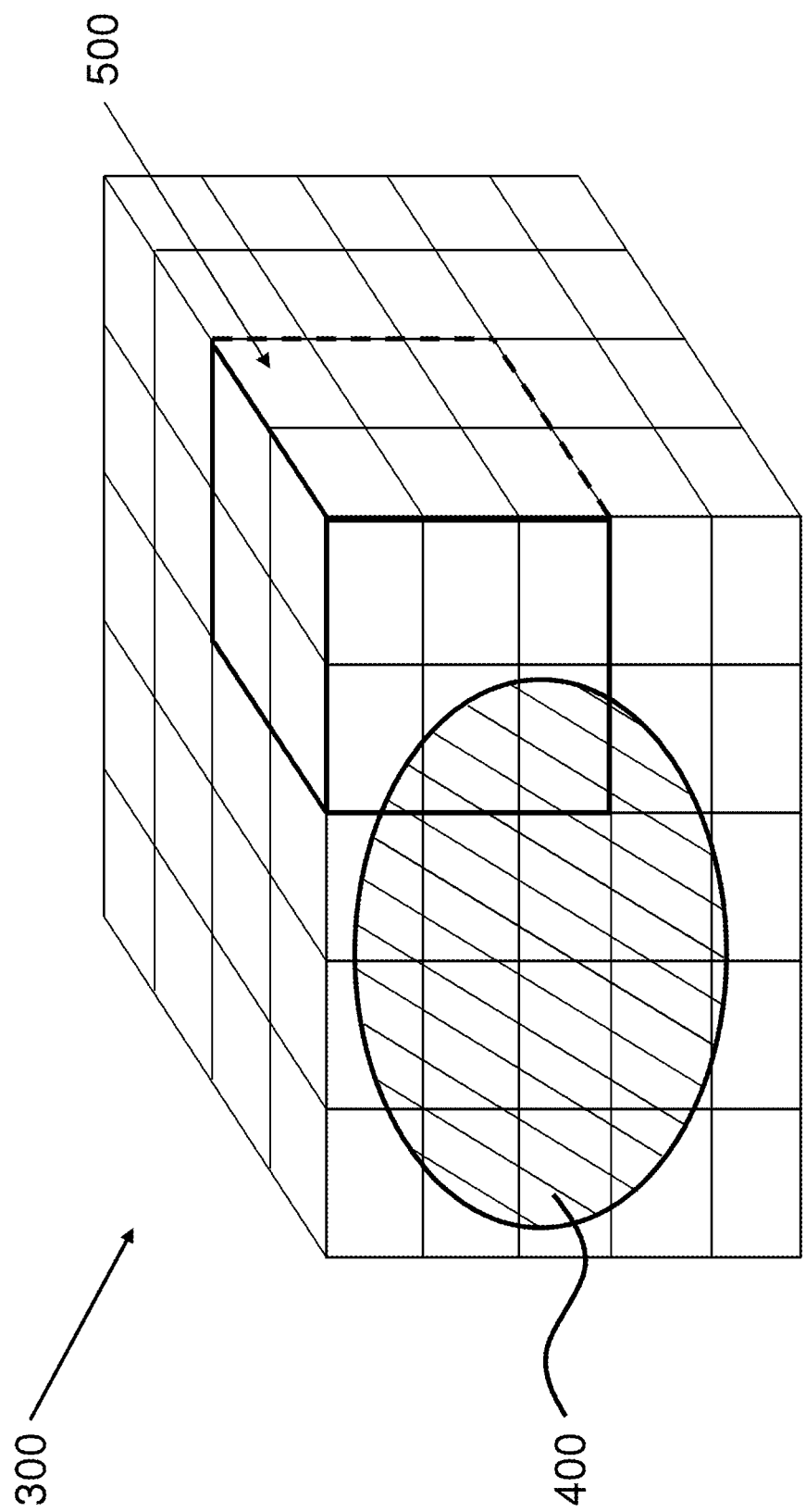
FIG. 5 is a diagram similar to FIG. 4 further portraying an example synthesized block.

Turning now to FIG. 5, a synthesized block 500 is shown overlaid on the block model of FIG. 4. Each synthesized block may be defined by synthesized block parameters associated with the size, geometry and position of the synthesized blocks within the synthesized block model the synthesized block parameters may be assigned by a user via a GUI 214 as will be further described herein. The synthesized block 500 may coincide completely or partially with a plurality of reference blocks. Synthesized block 500 coincides with a number of reference blocks having a concentration of ore from lode 400 as well as several reference blocks that do not coincide with the lode 400 and consequently, have no ore concentration. The re-blocking module 100 generates the synthesized block 500 and any attributes assigned to the synthesized block 500 based on attributes of the reference blocks which coincide wholly or partially with the synthesized block 500. For example, the reference blocks coinciding with the synthesized blocks have been assigned an ore grade attribute. The synthesized blocks could be assigned an ore grade attribute based on the ore grade attribute of the coinciding reference blocks.

The re-blocking module 100 generates at least one fractional attribute based on each of the coinciding reference blocks and their attributes. For example, the synthesized block may be assigned a fractional ore grade attribute. A fractional attribute may comprise a physical attribute as well as a spatial attribute, for example, a grade and a volume fraction.

By way of example, if half of the reference blocks coinciding with the synthesized block belong to a category comprising an ore grade of 2% whereas the remaining half of the reference blocks coinciding with the synthesized block belong to a category comprising an ore grade of 0%, the re-blocking module 100 may assign the synthesized block a fractional attribute specifying that 50% of the synthesized block comprises 2% ore. The fractional attribute may explicitly specify that 50% of the block comprises no ore. Providing a fractional attribute enables the model to retain information relating to the proportion of a block comprising a certain physical characteristic. For example, it may be more economically viable to extract ore if half of a synthesized block comprises a 2% gold ore rather than an entire synthesized block comprising 1% gold ore. By providing this information in the synthesized block model, the synthesized block size may be significantly larger than the block size of the models from which the synthesized model was generated without losing information relating to the fraction of the synthesized block comprising a particular attribute.

More generally, a density weighted fractional attribute of grade may be calculated for a synthesized block according to the equations:

$$G_{synth} = \frac{(\Sigma(G*V*F*D))}{(\Sigma(V*F*D))}; \text{ and}$$

$$F_{synth} = \frac{(\Sigma(V*F))}{V_{new}}$$

Where $G_{synth}$ is the grade of the synthesized block, $F_{synth}$ is the fraction of the synthesized block that represented by a particular category, G is the grade of each reference block, D is the specific gravity of each reference block, V is the volume of each reference block, $V_{new}$ is the volume of the synthesized block, and F is the volume fraction of each reference block that coincides with the synthesized block. As such, V*F is the volume of each reference block that coincides with the synthesized block. The summation sign signifies that the summation is made over all reference blocks coinciding with the synthesized block.

Similarly, an aggregate fractional attribute representing the aggregate value of a component in a synthesized block, for example, total grams of gold within a synthesized block, may be calculated using:

$$M_{synth} = \Sigma(M*F)$$

$$F_{synth} = \Sigma F$$

Where $M_{synth}$ is the aggregate value of a component contained in the synthesized block and M is the aggregate value of that same component in each reference block that coincides with the synthesized block.

The density fractional attribute of a synthesized block may be calculated according to the equations:

$$D_{synth} = \frac{(\Sigma(V*F*D))}{(\Sigma(V*F))}$$

-continued $$F_{synth} = \frac{(\Sigma(V*F))}{V_{new}}$$

Where $D_{synth}$ is the specific gravity of the synthesized block.

Figure 6:
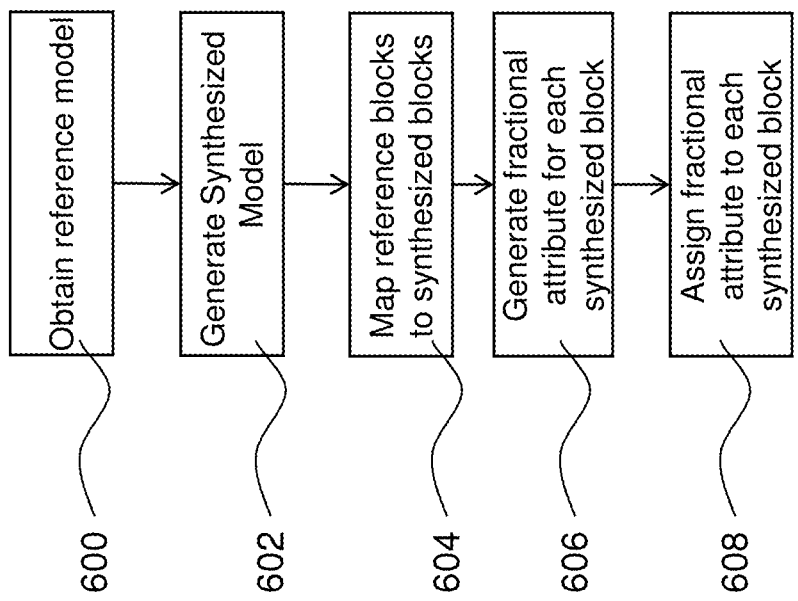
FIG. 6 is a process flow diagram outlining the an example process for re-blocking a block model.

Referring now to FIG. 6, a method of the re-blocking module 100 generated a synthesized model from a reference model is described. In step 600, the re-blocking module 100 obtains at least one reference model from the model retrieval module 102. The re-blocking module 100 then generates a synthesized model based on the at least one reference model. In step 604, the one or more reference models are mapped to the synthesized model to determine which reference blocks or portions of reference blocks coincide with each synthesized block. In step 606, the re-blocking module 100 generates at least one fractional attribute based on the reference blocks that coincide with the synthesized block. In step 608, the re-blocking module assigns the at least one generated fractional attribute to the corresponding synthesized block.

It will be appreciated that various synthesized block sizes and various attributes may be of interest to a user, for example, a mining engineer, when using the block model. For example, a user may wish to generate a synthesized block model comprising larger blocks if that user wishes to manipulate the block model on a lower power computer. Conversely, when assessing the value of a mining asset, it may be desirable to generate a synthesized block model comprising finer synthesized blocks to provide the user with a more precise estimate.

The user terminal 112 enables a user to specify the synthesized block parameters and attributes that the re-blocking module 100 will use to generate the synthesized model via the GUI 114. It may also be desirable for a user to view reference block parameters and reference block attributes of candidate reference block models prior to the re-blocking module 100 engaging in the re-blocking process.

The model retrieval module 102 may be operable to provide the user terminal 112 with reference block information from candidate reference block models. The user terminal 112 may then display the reference block information to a user via the GUI 114. The user may then make a selection of which reference block models should be used to generate the synthesized block model. Generating a synthesized model based on two or more reference models enables the synthesized model to include information from two separate reference models that may have been partitioned for disparate reasons. The two or more reference models may be used to generate a synthesized model if the reference models have a consistent set of attributes. Alternatively, the synthesized model may be generated to comprise a superset of attributes comprising the attributes of each reference model. The user may also wish to view the reference block information and attributes in order to determine which parameters should be provided to the re-blocking module 100 to be used when the re-blocking module 100 generates the synthesized block model.

Figure 7:
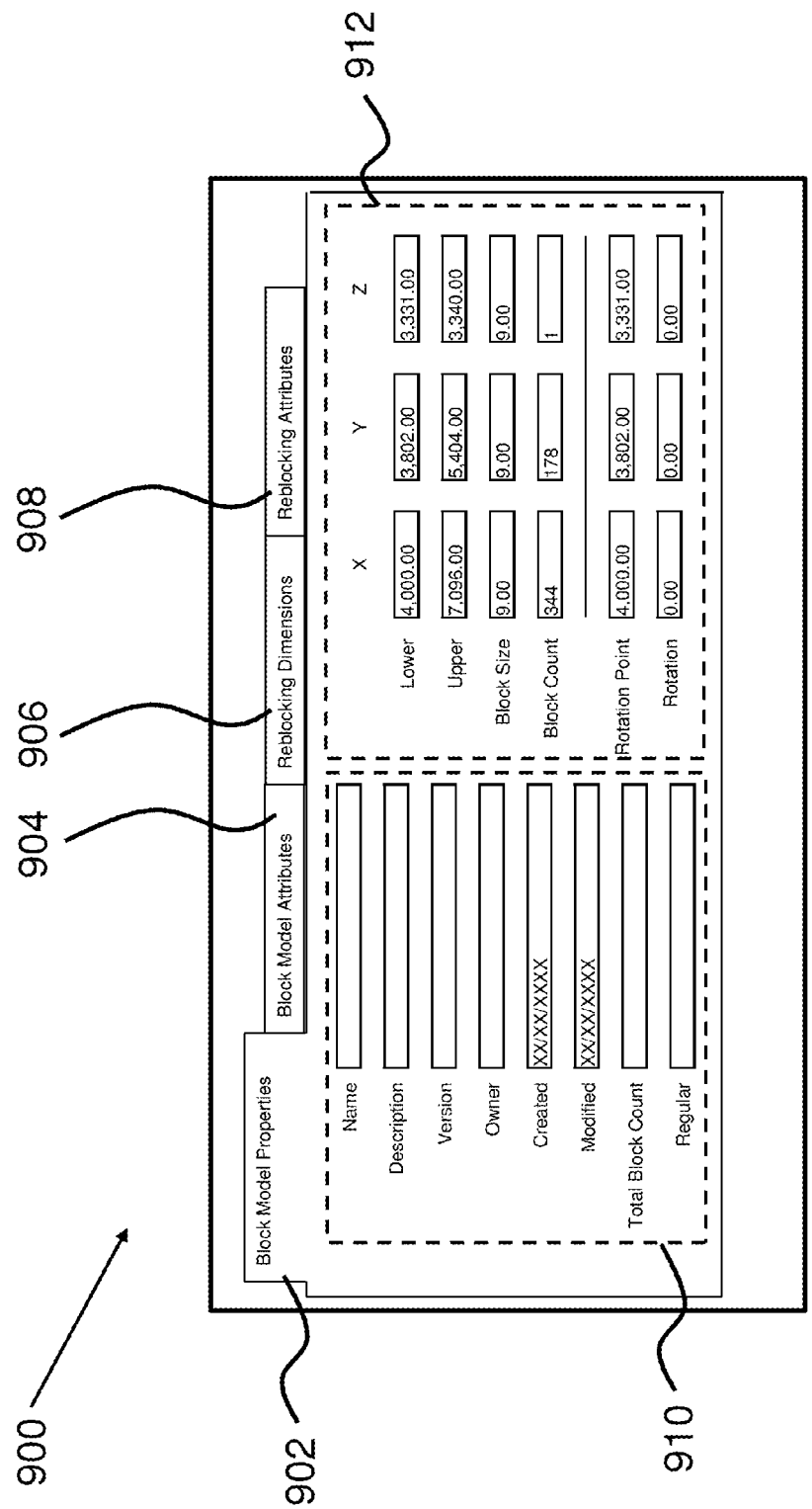
FIG. 7 is an example user interface for retrieving reference block models.

Turning to FIG. 7, an example user interface 900 for retrieving a reference block module is provided. The interface comprises several screens which, in this example, are accessible through tabs. For example, the block model properties tab 902, which is currently visible, provides the user with information relating to the properties of the candidate reference block models. Information relating to the reference block model file may be provided, as is exemplified by numeral 910. The file information may comprise a file name and version, a description of the file, the program used to create the file, the total number of blocks within the file and other relevant information. The block model properties tab 902 may also comprise reference block model information, as is exemplified by numeral 912. For example, this information may comprise the volume of a physical formation that the reference block model is modeling. The block size, number of blocks in each dimension, and other information relating to the geometry, size and orientation of blocks within the reference block model may also be provided.

A user viewing the user interface 900 may also wish to view attributes of the reference blocks. This is visible under tab 904, as will be further described below. The user, upon viewing block model information, parameters and attributes relating to candidate reference block models, may wish to set the parameters that the re-blocking module 100 will use to generate the synthesized block model. The user may set these parameters using the re-blocking dimensions tab 906 and may set parameters relating to the attributes of the synthesized block model via the re-blocking attributes tab 908.

Figure 8:
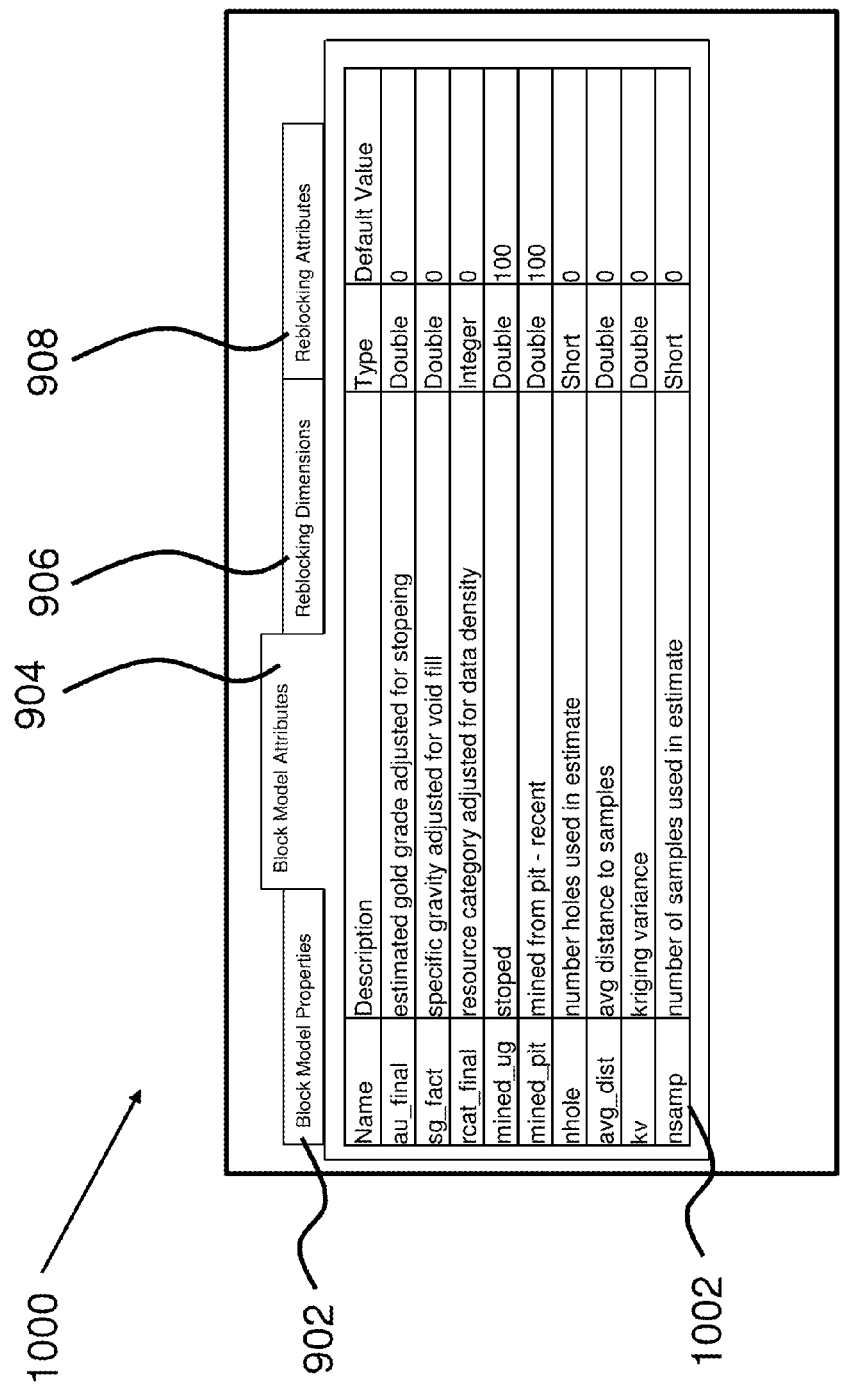
FIG. 8 is an example user interface for viewing attributes of a reference block model.

Each reference block within a candidate reference block module may comprise several attributes. Each attribute may be provided with a name and a description. The attributes may be various measures of a single property or may be measures of various physical properties relating to the physical formation that the reference block is modeling. Turning to FIG. 8, an example user interface 1000 for viewing candidate reference block model attributes 1002 is provided under the block model attributes tab 904.

Figure 9:
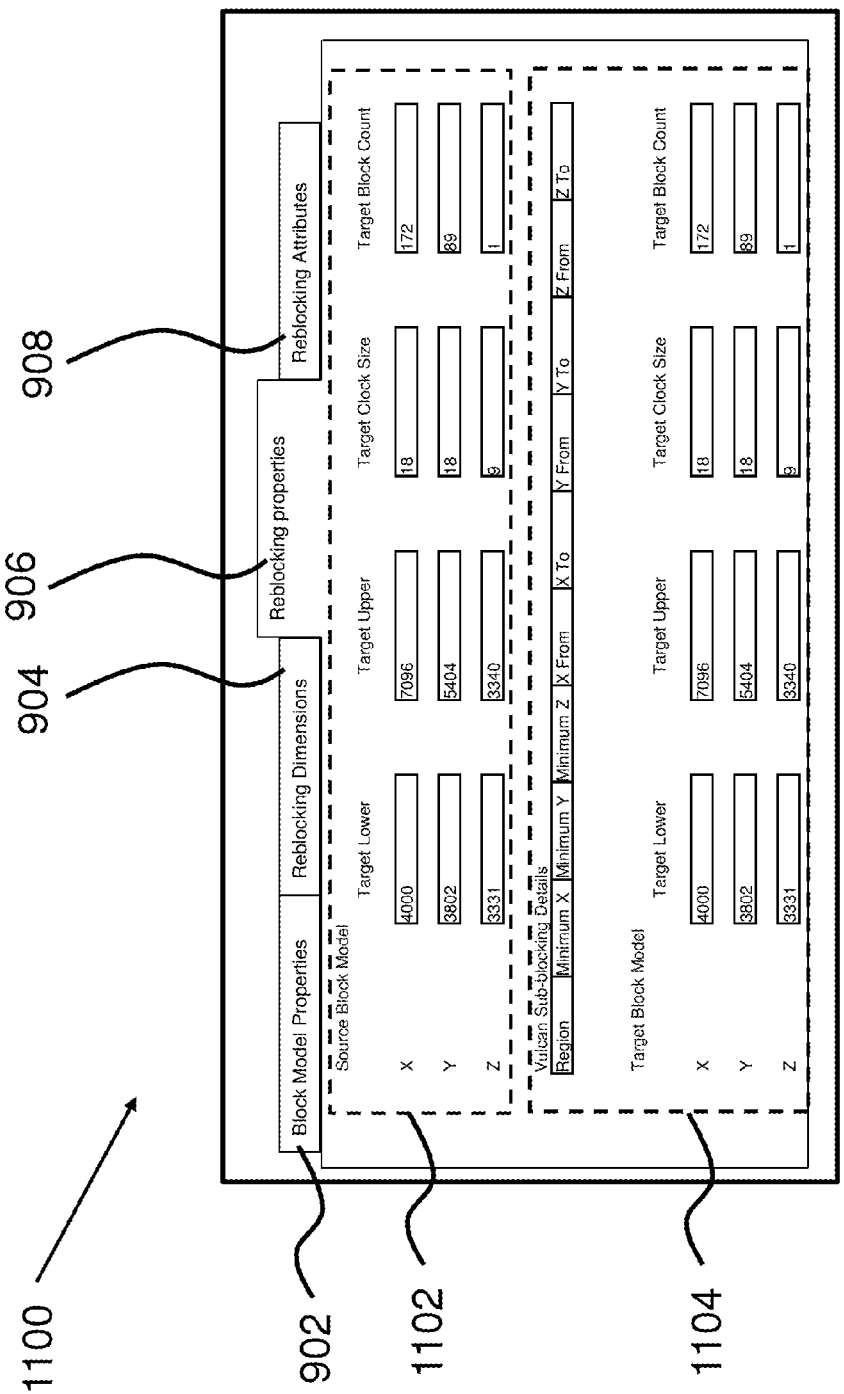
FIG. 9 is an example user interface for inputting re-blocking parameters.

Referring now to FIG. 9, an example user interface 1100 for inputting synthesized block model parameters is shown. This user interface may, for example, be accessed under the re-blocking dimensions tab 906. The re-blocking dimensions tab 906 may comprise an information area 1102 for viewing information relating to the reference block model or reference block models that are being used to generate the synthesized block model. The information provided in the information area 1102 may comprise information that is also displayed on the block model properties tab 902. For example, the information area 1102 displays information relating to the size of the reference block model, the size of the reference blocks within the reference block model, the total number of blocks within the reference block model and the dimensions across each axis of the reference block model. It can be appreciated that other information relating to reference block models may be provided in the information area 1102.

Providing the information on the re-blocking dimensions tab 906 enables a user to view the reference block model information while inputting parameters that will be used by the re-blocking module 100 to generate the synthesized block module.

The re-blocking dimensions tab 906 comprises an input area 1104 for inputting the desired dimensions of the synthesized block model, the size of each synthesized block within the synthesized block model and the number of reference blocks that are to be used to generate the synthesized block model. For example, the user may input the desired synthesized block size along each of the three dimensions of a rectangular prism reference block model. The user may also enter the dimensions of the entire synthesized block model. The input area 1104 may enable a user to enter the desired position of the synthesized block model. The input area 1104 may otherwise, or in addition, enable a user to specify the number of blocks that the user desires in the synthesized block model and the dimensions of the desired synthesized block model. The user terminal 112 may then compute the dimensions of the synthesized blocks required to achieve the desired number of synthesized blocks in the model and provide this value to the re-blocking module 100.

Figure 10:
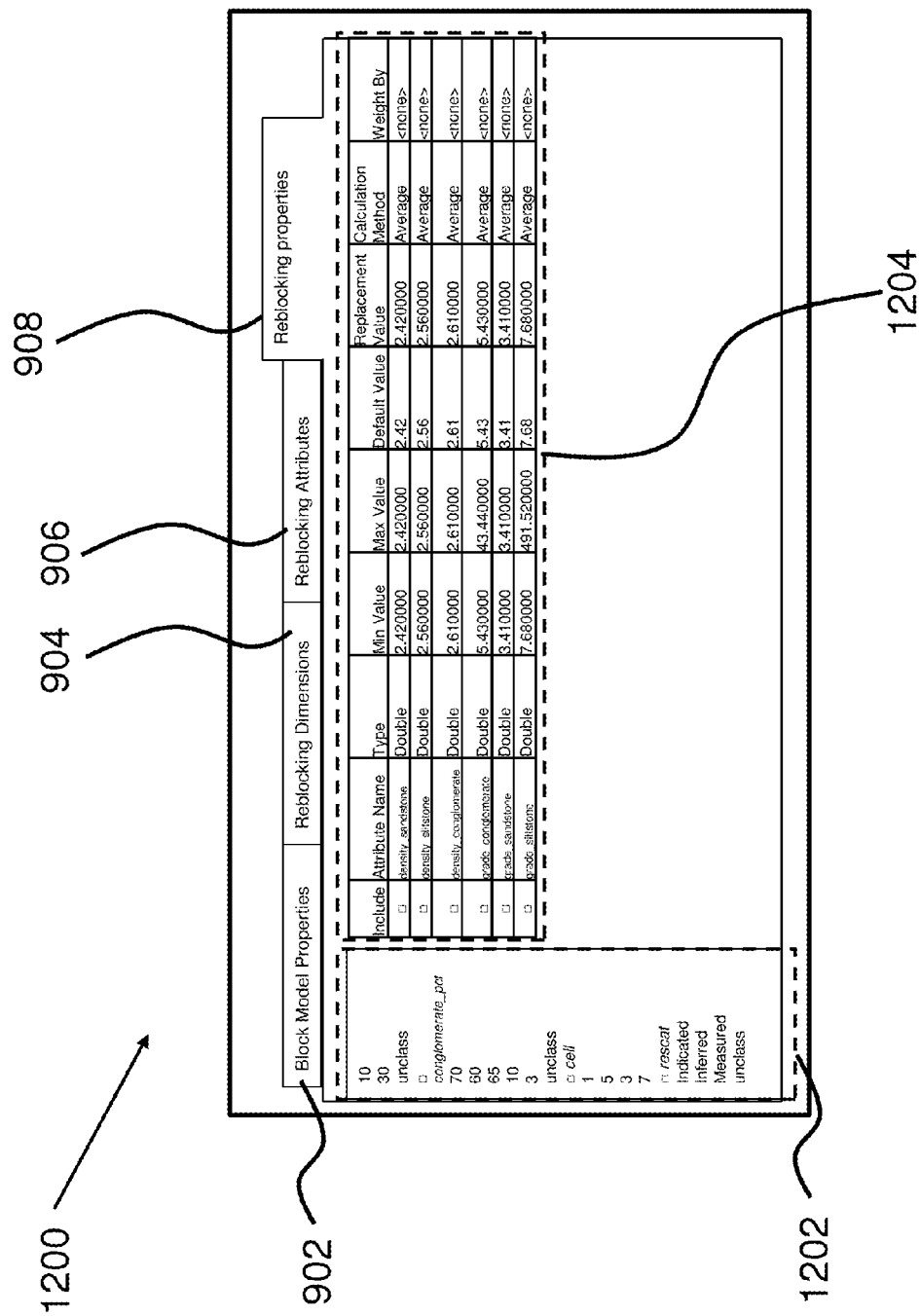
FIG. 10 is an example user interface for inputting re-blocking attribute parameters.

Turning now to FIG. 10, an example user interface 1200 for setting parameters relating to the attributes that the user desires the re-blocking module 100 to generate for the synthesized block model is provided. These attributes may comprise fractional attributes. The user interface may be accessed by activating the re-blocking attributes tab 908. Both fractional attributes and other attributes may be provided to the user interface 1200 under the re-blocking tab 908.

All attributes generated by the re-blocking module 100 are generated based on the reference block model or reference block models used to generate the synthesized block model. Similarly, all categories and groups generated by the re-blocking module 100 are generated based on the categories and groups that have previously been assigned to the reference block model or reference block models from which the synthesized model is generated. Attributes may be floating point attributes such as fractional attributes or may be non-floating point attributes. The user may enter the types of attributes that are to be calculated by the re-blocking module 100 and the types of calculations performed to generate the attributes of the synthesized block model in input table 1204. The GUI 114 may enable the user to enter the name of an attribute, the precision to which the attribute is to be calculated and the method of weighting the attribute based on the reference blocks that coincide with each synthesized block. For example, the GUI 114 enables the user to select an option to calculate an aggregate value for all gold ore within the synthesized block, an average value of gold ore, a density value, or a fractional value comprising an aggregate value, average value or density value of gold ore.

The GUI 114 may provide the user with an option to enter a group name for each non-floating point attribute. The GUI 114 may provide the user with an option to select from a list a category name or group name for non-floating point attributes corresponding to the category names and group names used in the reference model. The re-blocking module 100 is operable to generate a synthesized model and assign attributes to the synthesized blocks based on the category names and group names chosen by the user.

For example, a category name may comprise "waste", which may refer to material that has, for example, no economic value. Each synthesized block may be assigned several groups and/or categories. For example, a synthesized block may be assigned to the groups of "sedimentary" and "waste". Non-floating point attributes may also be used to generate fractional attributes. For example, a fractional attribute may be that 60% of a synthesized block comprises waste. The user may assign a category or a group name to synthesized blocks after the synthesized model is generated.

The re-blocking attributes tab 908 may further comprise a selection box 1202 which may comprise several pre-set attribute types which may be clicked to be included in the calculation. For example, a "waste" category may be useful in various synthesized block models. A user could decide to employ the "waste" category by clicking the waste category in the selection box 1202 to direct the re-blocking module to generate an attribute that represents the fraction of the synthesized block that contains waste. This option may be most useful when calculating attributes of synthesized blocks that are not unique to a particular model.

Re-blocking parameters used in generating a synthesized block module may be saved to be used later. For example, if a user is generating several models of a geologic asset comprising a gold deposit, the user may wish to enter the re-blocking parameters only once. After entering the re-blocking parameters once, the user terminal 112 may save the re-blocking parameters and load those parameters for future operations.

Figure 11:
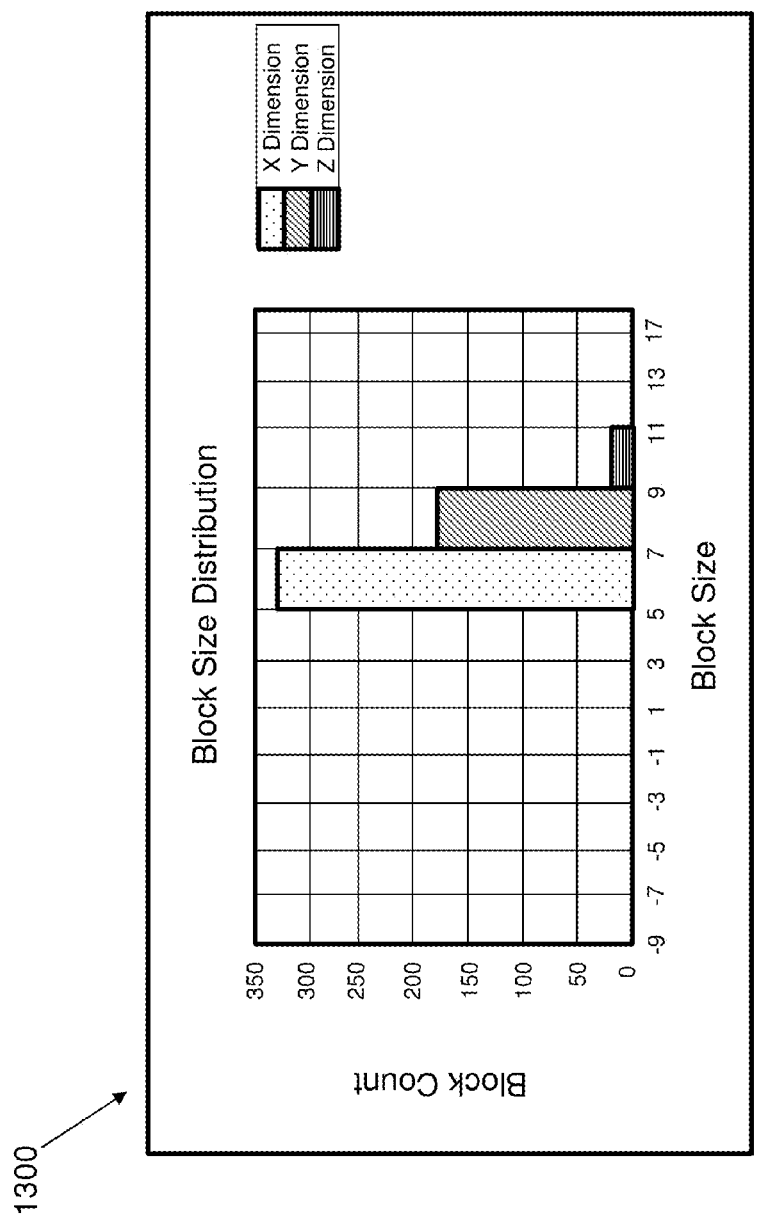
FIG. 11 is an example user interface for viewing block size distribution.

Turning now to FIG. 11, a block size distribution chart 1300 is provided to show the distribution of block sizes within a model. The block size distribution chart 1300 may be useful as a visual aid in addition to the information area 1102 of the block model properties tab 902. The block size distribution chart 1300 may be used to estimate the approximate size of the blocks in order to determine the appropriate size of the synthesized block model. For example, if most of the reference blocks correspond to approximately 0.1 m in size on each of the three axes, it may be desirable to generate a synthesized block model comprising synthesized blocks of 0.5 m on each axis. However, it may not be desirable to generate a synthesized block model of 0.05 m on each axis, as the model would be more difficult to manipulate and there would be no useful additional information stored within the model. Similarly, it may not be desirable to generate a synthesized block model with 50 m sides on each axis as the detail of the information from the reference block model may be lost.

General example embodiments of the methods and systems are provided below.

In one aspect, a method performed by a processor device for modeling a physical formation is provided. The method comprises obtaining a reference model of the physical formation with at least one physical parameter, the reference model comprising reference blocks and generating a synthesized model comprising one or more synthesized blocks. The method further comprises mapping the reference blocks to the synthesized blocks and generating one or more fractional attributes for one or more of the synthesized blocks based on at least one physical parameter of the one or more corresponding reference blocks.

The fractional attributes may, for example, comprise weighted fractional attributes. By way of example, the one or more synthesized blocks may be rectangular prisms. The position and geometry of each of the one or more synthesized blocks may be defined by six spatial elements. Each of the spatial elements may be stored in a separate file stream. The physical parameter may be, for example, a geologic attribute.

In an example, the method further comprises the steps of, prior to generating the synthesized model, receiving, from a user terminal, one or more synthesized block dimensions and generating the synthesized model according to the one or more synthesized block dimensions.

In another aspect, a computer readable medium comprising computer executable instructions for modeling a physical formation is provided. The computer readable medium comprises instructions for obtaining a reference model of the physical formation with at least one physical parameter, the reference model comprising reference blocks, and generating a synthesized model comprising one or more synthesized blocks. The instructions further comprise mapping the reference blocks to the synthesized blocks and generating one or more fractional attributes for one or more of the synthesized blocks based on at least one physical parameter of the one or more corresponding reference blocks.

In an example, the fractional attributes comprise weighted fractional attributes. In another example, the one or more synthesized blocks are rectangular prisms. In a further example, the position and geometry of each of the one or more synthesized blocks is defined by six spatial elements. In yet another example, each of the spatial elements is stored in a separate file stream. The physical parameter may be, for example, a geologic attribute.

In an example, the computer readable medium further comprises instructions for receiving, from a user terminal, one or more synthesized block dimensions prior to generating the synthesized model and generating the synthesized model according to the one or more synthesized block dimensions.

In yet another aspect, a system for modeling a physical formation is provided. The system comprises a model retrieval module operable to obtain a reference model of the physical formation with at least one physical parameter, the reference model comprising reference blocks and a re-blocking module. The re-blocking module is operable to generate a synthesized model comprising one or more synthesized blocks, map the reference blocks to the synthesized blocks, and generate one or more fractional attributes for one or more of the synthesized blocks based on at least one physical parameter of the one or more corresponding reference blocks.

In an example, the fractional attributes comprise weighted fractional attributes. In another example, the one or more synthesized blocks are rectangular prisms. In a further example, the position and geometry of each of the one or more synthesized blocks is defined by six spatial elements. In yet another example, a storage module stores each of the spatial elements in a separate file stream. The physical parameter may be, for example, a geologic attribute.

In a further example, the re-blocking module is further operable to receive, from a user terminal, one or more synthesized block dimensions prior to generating a synthesized model, and generate the synthesized model according to the one or more synthesized block dimensions.

Although the above has been described with reference to certain specific example embodiments, various modifications thereof will be apparent to those skilled in the art without departing from the scope of the claims appended hereto.

We claim:

1. A method, performed by a processor device for modeling a physical formation, comprising the steps of:
    obtaining a reference model of the physical formation, the physical formation comprising ore and the reference model comprising reference blocks;
    assigning an ore grade to each of the reference blocks;
    generating a synthesized model comprising one or more synthesized blocks;
    mapping the reference blocks to the synthesized blocks; and
    generating one or more fractional attributes of one or more of the synthesized blocks, the one or more fractional attributes comprising a synthesized ore grade attribute and a synthesized volume fraction that correspond to each other, and are derived from a number of the reference blocks with a same ore grade that are mapped to the one or more synthesized blocks.

2. The method of claim 1 wherein the synthesized ore grade attribute is density weighted and computed using a specific gravity of each of the reference blocks that are mapped to the one or more synthesized blocks.

3. The method of claim 1 wherein the one or more fractional attributes further comprise a synthesized specific gravity attribute that corresponds to the synthesized volume fraction.

4. The method of claim 1 wherein the one or more synthesized blocks are rectangular prisms and the position and geometry of each of the one or more synthesized blocks is defined by six spatial elements that are each one respectively stored on six different data streams, and the method further comprises the processor device accessing the six different data streams simultaneously.

5. The method of claim 4 wherein the six spatial elements comprise the three-dimensional coordinates of two opposing points for each of the one or more synthesized blocks.

6. The method of claim 1, wherein a density value is assigned to each of the reference blocks.

7. The method of claim 1, further comprising the steps of:
prior to generating the synthesized model, the processor device receiving, from a user terminal, one or more synthesized block dimensions; and
generating the synthesized model according to the one or more synthesized block dimensions.

8. A non-transitory machine readable medium comprising computer executable instructions for modeling a physical formation, the computer readable medium comprising instructions for:
obtaining a reference model of the physical formation, the physical formation comprising ore and the reference model comprising reference blocks;
assigning an ore grade to each of the reference blocks;
generating a synthesized model comprising one or more synthesized blocks;
mapping the reference blocks to the synthesized blocks; and
generating one or more fractional attributes of one or more of the synthesized blocks, the one or more fractional attributes comprising a synthesized ore grade attribute and a synthesized volume fraction that correspond to each other, and are derived from a number of the reference blocks with a same ore grade that are mapped to the one or more synthesized blocks.

9. The non-transitory machine readable medium of claim 8 wherein the synthesized ore grade attribute is density weighted and computed using a specific gravity of each of the reference blocks that are mapped to the one or more synthesized blocks.

10. The non-transitory machine readable medium of claim 8 wherein the one or more fractional attributes further comprise a synthesized specific gravity attribute that corresponds to the synthesized volume fraction.

11. The non-transitory machine readable medium of claim 8 wherein the one or more synthesized blocks are rectangular prisms and the position and geometry of each of the one or more synthesized blocks is defined by six spatial elements that are each one respectively stored on six different data streams, and the instructions further comprise accessing the six different data streams simultaneously.

12. The non-transitory machine readable medium of claim 11 wherein the six spatial elements comprise three-dimensional coordinates of two opposing points for each of the one or more synthesized blocks.

13. The non-transitory machine readable medium of claim 8 wherein a density value is assigned to each of the reference blocks.

14. The non-transitory machine readable medium of claim 8 further comprising instructions for:
receiving, from a user terminal, one or more synthesized block dimensions prior to generating the synthesized model; and
generating the synthesized model according to the one or more synthesized block dimensions.

15. A computing system for modeling a physical formation, the computing system comprising:
a processor device operable to at least:
obtain a reference model of the physical formation, the physical formation comprising ore and the reference model comprising reference blocks;
assign an ore grade to each of the reference blocks;
generate a synthesized model comprising one or more synthesized blocks;
map the reference blocks to the synthesized blocks; and
generate one or more fractional attributes of one or more of the synthesized blocks, the one or more fractional attributes comprising a synthesized ore grade attribute and a synthesized volume fraction that correspond to each other, and are derived from a number of the reference blocks with a same ore grade that are mapped to the one or more synthesized blocks;
memory operable to store the reference blocks and the one or more synthesized blocks; and
a display to display the one or more fractional attributes.

16. The computing system of claim 15 wherein the synthesized ore grade attribute is density weighted and computed using a specific gravity of each of the reference blocks that are mapped to the one or more synthesized blocks.

17. The computing system of claim 15 wherein the one or more fraction attributes further comprise a synthesized specific gravity attribute that corresponds to the synthesized volume fraction.

18. The computing system of claim 15 wherein the one or more synthesized blocks are rectangular prisms and the position and geometry of each of the one or more synthesized blocks is defined by six spatial elements that are each one respectively stored on six different data streams in the memory, and the processor is operable to access the six different data streams simultaneously.

19. The computing system of claim 18 wherein the six spatial elements comprise three-dimensional coordinates of two opposing points for each of the one or more synthesized blocks.

20. The computing system of claim 15, wherein a density value is assigned to each of the reference blocks.

21. The computing system of claim 15, further comprising a user terminal that includes the display, the user terminal operable to receive, one or more synthesized block dimensions prior to generating the synthesized model, and to generate the synthesized model according to the one or more synthesized block dimensions.

* * * * *